April 1, 1969 J. REGH ET AL 3,436,259

METHOD FOR PLATING AND POLISHING A SILICON PLANAR SURFACE

Filed May 12, 1966

INVENTORS
JOSEPH REGH
GENE A. SILVEY
JAMES R. GARDINER

BY George O. Saile
ATTORNEY

United States Patent Office 3,436,259
Patented Apr. 1, 1969

3,436,259

METHOD FOR PLATING AND POLISHING A SILICON PLANAR SURFACE

Joseph Regh, Wappingers Falls, Gene A. Silvey, Poughkeepsie, and James R. Gardiner, Wappingers Falls, N.Y., assignors to International Business Machines Corporation, Armonk, N.Y., a corporation of New York
Filed May 12, 1966, Ser. No. 549,586
Int. Cl. C23c 17/02; B44d 5/10, 5/12
U.S. Cl. 117—227 11 Claims This invention relates to a process for polishing planar silicon surfaces to a high degree of surface perfection.

Semiconductor devices, such as integrated monolithic circuits, transistors, diodes, passive devices and so forth, are formed by various additive techniques, such as diffusion and epitaxial growth, in planar silicon surfaces. The perfection of this silicon planar surface in regard to surface fine-structure down to an order of Angstrom units, surface planarity, uniformity and freedom from mechanical damage is a fundamental requirement for the manufacture of semiconductor devices. This can be more greatly appreciated by the fact that today more than 20,000 active and passive devices can be formed in an inch-and-a-quarter diameter silicon wafer. The surface planarity of the wafer becomes highly critical in photolithographic masking techniques because of the constant effort to decrease the physical device dimensions. Increase in distance between the mask and wafer surface caused by significant deviations from the ideally planar wafer unfavorably affects the image resoultion of fine device structure on the surface of the wafer. This non-planarity effect becomes more pronounced as you proceed toward the edge of the wafer. Poor device yields are the result at the periphery of the wafer. The extent of the poor device area is dependent upon the degree of non-planarity of the wafer. The surface fine-structure characteristic over the entire wafer is also an extremely important characteristic as it can produce poor devices throughout the wafer. Mechanical or physical defects and irregularities in the planar silicon surface also produce marginal or useless devices throughout the entire surface which also can result in the waste of manufacturing time and expense.

The prior art has used a wide variety of processes in an attempt to overcome these critical problems. Some of these processes include chemical etching, electropolishing, mechanical lapping and polishing, and combinations of these polishing steps. The usual initial procedure for polishing planar silicon wafers involves a series of abrading and polishing steps using polishing ingredients of graduated fineness. These mechanical polishing techniques are able to remove most surface scratches and pits. However, they are unable to remove damage to the crystal structure just below the surface caused by the preceding coarser mechanical polishing steps. Because of this, the final step in the polishing procedure is normally a chemical etch to remove these defects in the silicon material. While these procedures have greatly improved the surface characteristics of silicon surfaces for manufacture of semiconductor devices, the procedures are time consuming and still do not produce the crystallographically perfect silicon planar surface. Further, non-planarity and surface fine-structure of the polished wafer are still not completely solved problems.

It is therefore an object of this invention to provide a process for polishing silicon semiconductor surfaces to a high degree of surface perfection.

It is another object of this invention to provide a chemical-mechanical method of polishing silicon semiconductor planar surfaces which produces near perfect surfaces.

It is a further object of this invention to provide a chemical-mechanical method of polishing silicon wafers which produces a highly planar and excellent surface fine-structure wafer surface.

These and other objects are accomplished in accordance with the broad aspects of the present invention by providing a process involving a simultaneous combination of mechanical and chemical polishing procedures. The silicon planar surface to be polished is maintained continuously wetted with an excess quantity of a displacement plating solution, while it is continuously wiped, using substantial pressure, with a firm surface. The displacement plating solution contains a cupric or silver cation and a fluoride anion and is maintained at a pH of less than 7. The result of this wetting of the silicon surface with the solution is the displacement plating of copper or silver metal for the silicon on the silicon planar surface. The simultaneous and continuous wiping of the silicon surface removes the copper or silver metal from the high areas on the silicon surface. In this manner, the silicon surface is brought to a state of substantial planarity, excellent surface fine-structure and freedom from damage.

The foregoing and other objects, features and advantages of the invention will be apparent from the following more particular description of the preferred embodiments of the invention, as illustrated in the accompanying drawings.

Figures 1, 2, 3, 4:
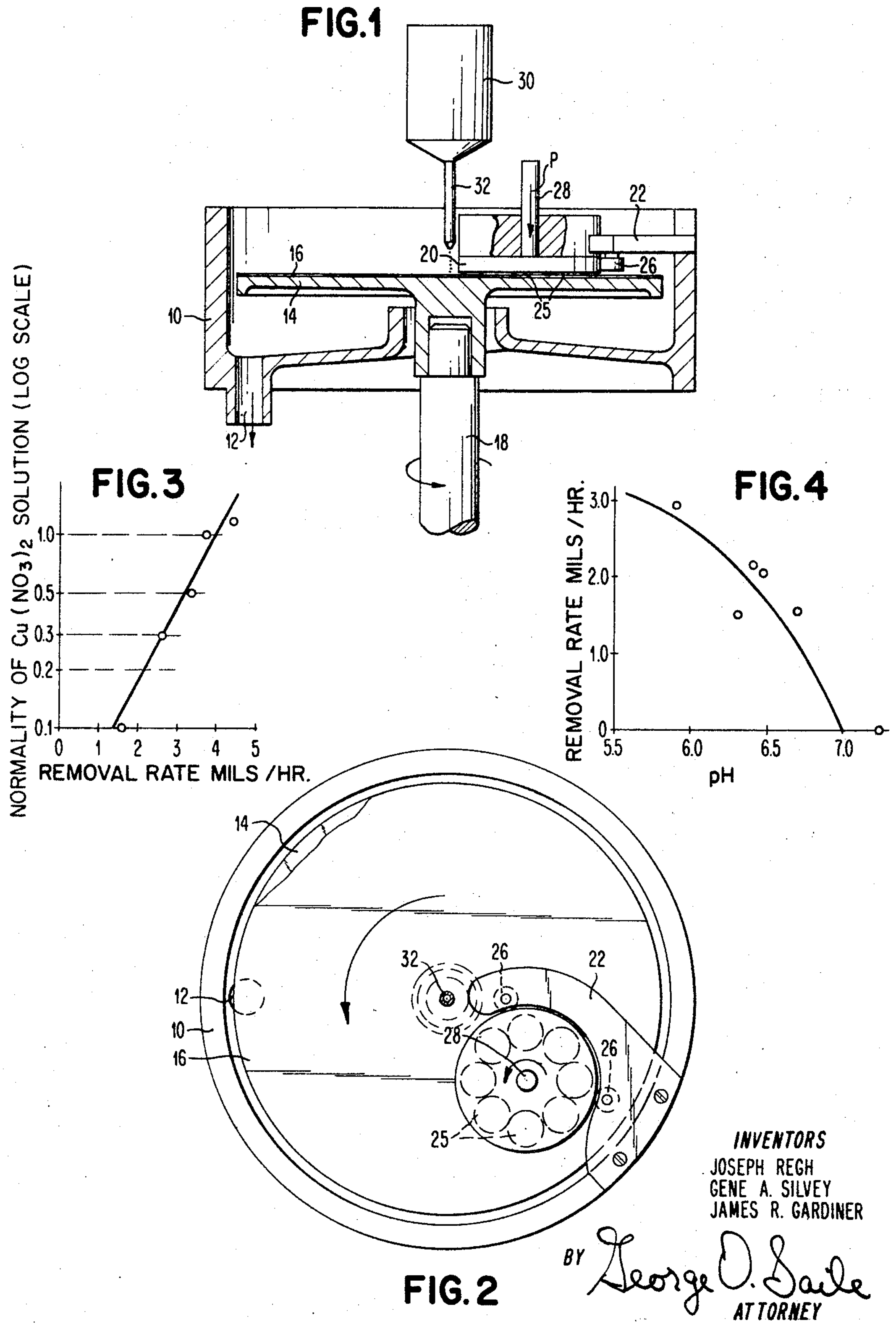
FIGURE 1 shows a side view of an apparatus, partially in section which is useful in practising the polishing process of the invention.
FIGURE 2 is a plan view of the FIGURE 1 apparatus.
FIGURE 3 is a graphical representation of the removal rate of silicon versus the normality of cupric nitrate solution at constant ammonium fluoride concentration.
FIGURE 4 is a graphical representation showing the removal rate of silicon versus the cupric nitrate and ammonium fluoride solution pH.

The silicon planar surface which is generally used as the starting surface for the additive processes to produce semiconductor devices is in the form of a thin monocrystalline silicon wafer. These silicon wafers are sawed from cylinders of monocrystalline silicon, and lapped on a lapping machine using a fine abrasive. The silicon wafer surface has a fairly uniform roughness, but is mechanically damaged. At this point, the polishing procedure of the present invention is initiated.

Referring now to FIGURES 1 and 2, the simultaneous chemical-mechanical process of the present invention can be accomplished using the apparatus shown. The polishing machine includes a bowl 10 having a fluid outlet 12 and a driven plate 14. Mounted on the plate 14 by any suitable means (not shown) is a soft, firm surface 16 composed of a thick, porous paper, such as Pellon paper, or a napped cloth, such as Microcloth. The plate 14 is rotated by means of suitable driving means (not shown) coupled through shaft 18. A smaller plate 20 with silicon wafers 25 to be polished, is mounted on the plate by means of suitable adhesive or other suitable method. This plate 20 with its wafers mounted thereon is maintained against the surface 16 by arm 22 having bearing surfaces 26 and a substantial pressure P applied through shaft 28 to urge the wafers strongly against the surface 16. The arm 22 is suspended from the polishing bowl edge and positioned on the side of the plate 20 in the path of its normal rotation which is caused by the rotation of plate 14. The rotation of plate 14 produces a rotation of the plate 20. The surface of the silicon wafers is continuously wetted with excess quantity of a displacement plating solution by flowing the solution from container 30 through its restricted opening 32 onto the surface 16 of rotating plate 14. Excess fluid is splashed from the end of the rotating plate 14 and flows out of the excess fluid opening 12.

The solution used contains an aqueous copper or silver cation and a fluoride anion. The copper or silver cation can be brought into solution by any of their soluble salts. However, their halide salts are the least preferred because they reduce the removal rate of silicon to one sixth the quantity given when other cupric or silver salts are used. The fluoride anion can be brought into solution by any soluble fluoride compound such as ammonium fluoride, sodium fluoride or potassium fluoride.

The solution pH must be maintained less than 7 and preferably between 5 and 7 to obtain the results described above in the present invention. To adjust the pH, hydrofluoric acid can be added to the solution. The pH is preferably above 5 because lower pH solutions will attack and deteriorate the exposed portions of the machine and the paper or napped cloth surface.

A polishing solution having traces, such as less than 0.1 N, of cupric ion, will act as a polishing vehicle where only small amounts of material, for example a few microns, have to be removed. Alternately, if one or more mils are to be removed, normalities of greater than 0.1 N will generally be required. FIGURE 3 illustrates the effect of removal rate against normality of cupric nitrate. The FIGURE 4 shows that a wide variation of removal rate is possible for a given cupric ion concentration depending upon the solution pH. Further, an increase in fluoride ion produces an increase in removal rate but this effect is not as pronounced an effect as the cupric ion concentration or pH effects.

There must be a relative motion between the wafer surface being polished and the polishing surface. The pressure applied is critical and must be greater than about 1.8 pounds per square inch with a 12-inch diameter polishing plate and 80 to 250 r.p.m. rotation speed to obtain the desired polishing results. This pressure can be lowered if higher speeds of the wafers moving across the polishing plate are used. These higher speeds can, alternately, be caused by increasing the polishing plate rotation speed, increasing the diameter of the polishing plate, increasing the diameter of the wafer mounting plate or any combinations thereof. It is also preferred that the rotation of plate 14 be such, in relation to the weight or pressure P applied to the plate 20 that the plate 20 also is caused to rotate.

It is theorized that the removal rate is a function of the cupric ion concentration in the solution. The maximum removal rate is controlled by the maximum solubility of copper fluoride in the solution. Assuming an excess of fluoride ion in the solution, any addition of the cupric ion would tend to shift the chemical reaction toward equilibrium. The removal rate is also pH dependent. It is clear that the solubility of copper fluoride varies with the pH of the solution, and at constant copper ion concentration, the cutoff point for the chemical-mechanical polishing effect is the pH of 7. This is explained by the fact that copper fluoride transforms in the solution with ammonium fluoride into a copper ammonium fluoride complex which holds the copper in a form that prevents displacement plating where the pH is 7 or greater.

The chemical-mechanical polishing process of this invention was tried by replacing the copper ion with other ions. Ammonium, cadmium and sodium were all tried. However, the polishing process of the present invention would not operate. Further, an attempt was made to polish germanium wafers according to the present process. It was found that in order to remove significant amounts of germanium a very strongly acidic polishing solution had to be used. This makes the solution for germanium polishing very corrosive in nature with respect to the peripheral equipment.

A final step in the process is preferred to free the polishing plate of residual polishing solution and to remove the maximum amount of metal from the polished silicon surface. This step is simply to replace the flow of plating solution with a flow of non-plating medium such as water and to allow the soft, firm surface 16 to stop the silicon removal action and to thereafter remove the metal for a short period of time.

The following examples are included merely to aid in the understanding of the invention, and variations may be made by one skilled in the art without departing from the spirit and scope of this invention.

EXAMPLES 1–5

A cylinder of monocrystalline silicon of one inch in diameter was sliced into a large number of wafers, approximately 12 mils in thickness. The surfaces of the wafers were lapped, using a 12-micron lapping compound. The wafers were then ultrasonically cleaned with soap and water. Groups of 11 wafers were mounted on plates 20 using glycol phthalate resin as the adhesive. Each of these groups of wafers were lapped coplanar on a lapping machine using 5-micron alumina abrasive. This operation was followed by a short, 5 to 15 minutes, one micron diamond polish to remove the high points left on the wafer surfaces by the lapping operation. At this point, the thickness of the wafers was recorded before proceeding with the simultaneous chemical-mechanical polishing. One measurement was made in the center of each wafer before and after the polishing. The FIGURE 1 and FIGURE 2 polishing machine was used and a constant pressure of about 2.1 pounds per square inch was applied in all examples. The diameter of plate 14 was 12 inches and plate 20 was 5½ inches. Microcloth was used as the surface layer 16. The revolutions per minute for the plate 14 were 246 r.p.m. In all examples the polishing time was 30 minutes. The following table gives the concentration of the ammonium fluoride and cupric nitrate in the plating solution, the pH and the removal rate for each of the examples. A total of about 300 cubic centimeters of solution was used during polishing in each example.

TABLE

| Example | $NH_4F$ (conc.) | $Cu(NO_3)_2$ (conc.) | pH | Removal rate (mils/hr.) |
|---|---|---|---|---|
| 1 | 6.5 N | 0.1 N | 6.4 | 1.6 |
| 2 | 6.8 N | 0.3 N | 6.4 | 2.5 |
| 3 | 6.8 N | 0.5 N | 6.4 | 3.4 |
| 4 | 6.8 N | 1.0 N | 6.4 | 3.9 |
| 5 | 6.8 N | 1.18 N | 6.4 | 4.5 |

After 29 minutes of polishing, the polishing solution was replaced with water. Water was flowed onto the plate through orifice 32 for 1 minute. The machine was then stopped, and the wafers were cleaned with water and then removed from plate 20. The wafers were then cleaned by submersing them in acetone to remove glycol phthalate mounting resin. Residual copper was then removed with hot concentrated nitric acid, followed by several rinses with deionized water. The resulting removal rate of silicon in mils per hour was plotted against the normality of the cupric nitrate solution in FIGURE 3. The results of these examples indicate the approximately exponential relationship between the removal rate and the cupric nitrate normality in the solution. The wafer surfaces were mirror-like and perfect to the eye in each of the examples. Interferometric examination of the surface yielded values for the surface fine-structure of about 150 Angstroms. The deviation from planarity was less than one micron over most of the surface.

EXAMPLE 6

The procedure of Examples 1 through 5 was followed. Six polishing solutions of 300 cubic centimeters each were made up. Each contained 0.3 N cupric nitrate and 6.8 N ammonium fluoride in water. The pH of the solutions were 5.9, 6.3, 6.4, 6.5, 6.7 and 7.25. The pH's were adjusted from 6.4 by additions of hydrofluoric acid or ammonium hydroxide, depending upon which way the pH was to be adjusted. All other procedural steps were identical to those of Examples 1 through 5. The resulting wafers were measured for removal rate and the curve of FIGURE 4 resulted. The results show that polishing is possible only when the solution pH is less than 7 and that as the pH becomes more acidic the removal rate increases. All wafers, with the exception of those wafers which had no removal rate because the pH of the solution was above 7.0, produced good surfaces having a high degree of perfection to the eye. Interferometer photographs also showed that these wafers were all highly acceptable for subsequent semiconductor device fabrication. The surfaces had variation in fine-structure of about 150 Angstroms. The deviation from planarity was again less than one micron over most of the surface.

EXAMPLE 7

Examples 1 through 5 procedure was followed. However, the polishing solution was altered by substituting sodium fluoride for the ammonium fluoride. The solution contained 0.3 N cupric nitrate and 6.8 N sodium fluoride in water. Hydrofluoride acid was added to bring the pH to 5.2. The resulting removal rate was 0.4 mil per hour. The polished planar surface of each of the wafers was perfect to the eye. Interferometer measurements also showed a perfect surface. The surfaces had variation in fine-structure of about 150 Angstroms and deviation from planarity was less than one micron.

EXAMPLE 8

A typical polished wafer was selected from the wafers resulting from Examples 1–5. A second wafer which was identical in physical size and preparation up to the diamond polishing step of Example 1–5 procedure was selected. This second wafer was polished using a submicron alumina abrasive aqueous suspension applied to a polishing paper which was mechanically moved over the surface of the wafer until the wafer was highly polished. Both wafers appeared to have identical perfect surfaces. The wafers were placed on a carbon susceptor in 1¼ inch recesses located in an epitaxial growth chamber. The wafers were etched for 5 minutes at about 1258° C. with a vapor of 4.5% hydrochloric acid in hydrogen continuously flowing over the wafers. Approximately 1 mil of material was removed from the polished surface. A silicon, arsenic doped epitaxial layer of 5 microns of 0.1 ohm/centimeters was deposited on each of the wafers. After the deposition, the wafer surfaces were examined and found to be in good condition. The wafers were Sirtl-etched and stacking-fault count recorded according to the conventional procedure described in the Sirtl et al. article published in Zeitschrift fur Metallkunde, vol. 52, No. 8, 1961. The stacking faults were counted in a representative sample area of each wafer using a microscope. The mechanically polished wafer had a stacking fault count of 254 per square centimeter. The chemical-mechanically polished wafer had a stacking fault count of 58.5 per square centimeter.

EXAMPLE 9

Example 8 was repeated with the single exception that the vapor hydrochloric acid etch was replaced with a hydrogen bake for 5 minutes at about 1258° C. to clean away residual silicon dioxide from the wafer's surface. There was no silicon removed from the wafers. The resulting Sirtl etch and stacking fault count for the chemical-mechanically polished wafer was 88.7 per square centimeter. The stacking fault count could not be made for the mechanically polished wafer because the faults were too numerous to count.

Examples 8 and 9 show the effectiveness of the chemical-mechanical polishing method of this invention to produce near-damage free wafers without the necessity of a chemical etching step following polishing. The epitaxial growth on a given wafer, of course, magnifies the faults in the surface of the wafer. The results of Example 9 indicate the necessity for a chemical etch following the mechanical polishing step, because the large number of stacking faults in the wafer epitaxial layer of Example 9 cannot be tolerated. However, the 88.7 per square centimeter value for the chemical-mechanical polished wafer is well within the acceptable range. The additional etching step is undesirable because it adds to the cost of the process and, more important, it adversely affects the planarity of the resulting wafer surface.

What is claimed is:

1. A method for polishing a silicon planar surface to a high degree of surface perfection suitable for epitaxial deposition comprising:

maintaining the said silicon surface continuously wetted with an excess quantity of a displacement plating solution having a pH less than 7 containing a cupric cation and fluoride anion to cause a displacement plating of the cation onto the said silicon surface in the form of the metal; and continuously wiping the said silicon surface with a firm surface using a substantial pressure while maintaining a relative movement between the said silicon surface and said firm surface to remove the plated said metal from the high points of said silicon surface.

2. The method of claim 1 wherein the said solution is aqueous; the cupric cation is brought into the said solution by use of cupric nitrate; and the fluoride anion is brought into said solution by use of ammonium fluoride.

3. The method of claim 1 wherein the solution is maintained at a pH between about 5 and 7.

4. The method of claim 1 wherein the said pressure applied is above about 1.8 pounds per square inch.

5. The method of claim 1 wherein the said planar silicon surface is one face of a silicon wafer and said firm surface is a supported paper layer.

6. The method of claim 1 wherein the said planar silicon surface is one face of a silicon wafer and said firm surface is a supported napped cloth layer.

7. A method for polishing a silicon planar surface to a high degree of surface perfection suitable for epitaxial deposition comprising:

maintaining the said silicon surface continuously wetted with an excess quantity of a displacement plating solution having a pH less than 7 containing a silver cation and a fluoride anion to cause a displacement plating of the cation onto the said silicon surface in the form of the metal; and continuously wiping the said silicon surface with a firm surface using a substantial pressure while maintaining a relative movement between the said silicon surface and said firm surface to remove the plated said metal from the high points of said silicon surface.

8. A method for polishing a monocrystalline silicon planar surface to a high degree of surface perfection suitable for epitaxial deposition comprising:

maintaining the said silicon surface continuously wetted with an excess quantity of an aqueous displacement plating solution having a pH less than 7 containing a cupric cation and a fluoride anion to cause a displacement plating of the cation onto the said silicon surface in the form of the metal;

continuously wiping the said silicon surface with a soft, firm surface using a pressure greater than about 1.8 pounds per square inch while maintaining a relative rotating movement between the said silicon surface and the said soft surface to remove the plated said metal from the high points of said silicon surface; and after the said silicon surface has been adequately polished, replacing said plating solution with a non-plating medium wetting the said silicon surface to prevent further polishing and allow said firm surface to remove the maximum amount of said metal possible from said polished silicon surface.

9. The method of claim 8 wherein the said solution is aqueous; the copper cation is brought into the said solution by use of cupric nitrate; the fluoride anion is brought into said solution by use of ammonium fluoride; and the said solution pH is maintained between about 5 and 7.

10. The method of claim 8 wherein the said planar silicon surface is one face of a silicon wafer and said firm surface is a supported paper layer.

11. The method of claim 8 wherein the said planar silicon surface is one face of a silicon wafer and said firm surface is a supported napped cloth layer.

References Cited

UNITED STATES PATENTS

| | | | |
|---|---|---|---|
| 3,224,904 | 12/1965 | Klein | 156—17 XR |
| 3,342,652 | 9/1967 | Reisman et al. | 156—17 |

OTHER REFERENCES

R. Lieberman et al.: Surface Preparation of Semiconductors by Group I–B Displacement Plating, Journal of Electrochemical Soc., vol. III, p. 62c, March 1964.

WILLIAM L. JARVIS, *Primary Examiner.*

U.S. Cl. X.R.

117—120; 134—4; 156—17